(12) United States Patent
Chuang (10) Patent No.: US 9,859,187 B2
(45) Date of Patent: Jan. 2, 2018

(54) BALL GRID ARRAY PACKAGE WITH PROTECTIVE CIRCUITRY LAYOUT AND A SUBSTRATE UTILIZED IN THE PACKAGE

(71) Applicant: POWERTECH TECHNOLOGY INC., Hsinchu (TW)

(72) Inventor: Yong-Cheng Chuang, Hsinchu (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/385,320

(22) Filed: Dec. 20, 2016

(65) Prior Publication Data

US 2017/0194231 A1 Jul. 6, 2017

(30) Foreign Application Priority Data

Dec. 31, 2015 (TW) .............................. 104144779 A (51) Int. Cl.
| | |
|---|---|
| *H01L 23/00* | (2006.01) |
| *H01L 23/367* | (2006.01) |
| *H01L 23/31* | (2006.01) |
| *H01L 23/498* | (2006.01) |

(52) U.S. Cl.
CPC ...... *H01L 23/3675* (2013.01); *H01L 23/3128* (2013.01); *H01L 23/49816* (2013.01); *H01L 24/09* (2013.01); *H01L 24/17* (2013.01); *H01L 2224/0401* (2013.01); *H01L 2224/17132* (2013.01); *H01L 2924/15311* (2013.01); *H01L 2924/15331* (2013.01); *H01L 2924/351* (2013.01); *H01L 2924/3512* (2013.01)

(58) Field of Classification Search
CPC ..... H01L 2924/15311; H01L 2924/351; H01L 23/49816; H01L 2924/3512; H01L 2924/15331
See application file for complete search history.

(56) References Cited

U.S. PATENT DOCUMENTS

| | | | |
|---|---|---|---|
| 6,340,797 B1 * | 1/2002 | Yoshida | H05K 1/112 174/260 |
| 6,509,645 B2 * | 1/2003 | Tatsumi | H01L 25/065 257/618 |
| 7,919,858 B2 * | 4/2011 | Danno | H01L 21/6835 257/690 |

(Continued)

*Primary Examiner* — Ngan Ngo
(74) *Attorney, Agent, or Firm* — JCIPRNET (57) ABSTRACT

Disclosed is a BGA package with protective circuitry layouts to prevent cracks of the bottom circuit in the specific area of the substrate leading to package failure and to enhance packaging yield of BGA packages. A chip is disposed on the upper surface of the substrate. A chip projective area is defined inside the bottom surface of the substrate and is established by vertically projecting the edges of the chip on the upper surface to the bottom surface of the substrate. At least an external contact pad vulnerable to thermal stress is located within the chip projective area. A protective area and a wiring area are respectively defined in the chip projective area at two opposing sides of the external contact pad. A plurality of protective mini-pads are arranged in a dotted-line layout and disposed in the projective area to partially surround the external contact pad to avoid thermal stress concentrated on the protective area and to further prevent circuitry cracks in the package structure.

16 Claims, 6 Drawing Sheets

(56) References Cited

U.S. PATENT DOCUMENTS

| | | | | |
|---|---|---|---|---|
| 8,076,787 | B2* | 12/2011 | Hayashi | ............ H01L 23/49838 |
| | | | | 257/773 |
| 9,287,189 | B2* | 3/2016 | Bhagavat | .............. H01L 23/147 |
| 2017/0148699 | A1* | 5/2017 | Seo | ...................... H01L 23/3128 |
| 2017/0186701 | A1* | 6/2017 | Cai | ........................ H01L 23/562 |

* cited by examiner

BALL GRID ARRAY PACKAGE WITH PROTECTIVE CIRCUITRY LAYOUT AND A SUBSTRATE UTILIZED IN THE PACKAGE

FIELD OF THE INVENTION

The present invention relates to a semiconductor package structure and more specifically to a Ball Grid Array (BGA) package with protective circuitry layouts and a substrate utilized in the package.

BACKGROUND OF THE INVENTION

Ball Grid Array (BGA) packaging is an Integrated Circuit (IC) packaging technology. Therein, a chip is disposed inside the package and the package is electrically connected to the Printed Circuit Board (PCB) through a plurality of solder balls. Solder balls are disposed on the corresponding external contact pads disposed on the bottom surface of the substrate of the Ball Grid Array package. Therefore, the Ball Grid Array package has more external I/O pins, shorter wiring distance and faster signal transmission when compared to the conventional Dual Inline Package (DIP).

Figure 1:
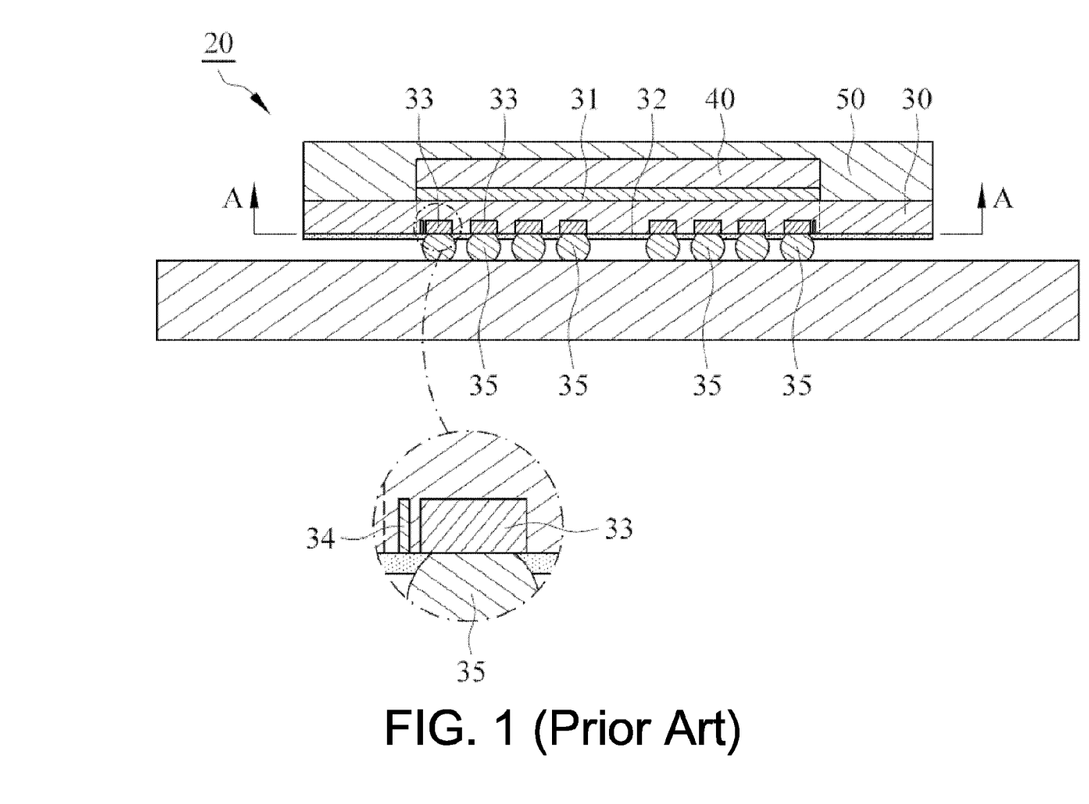
FIG. 1 is a cross-sectional view of a conventional Ball Grid Array package surface-mounted on a printed circuit board.
Figure 2:
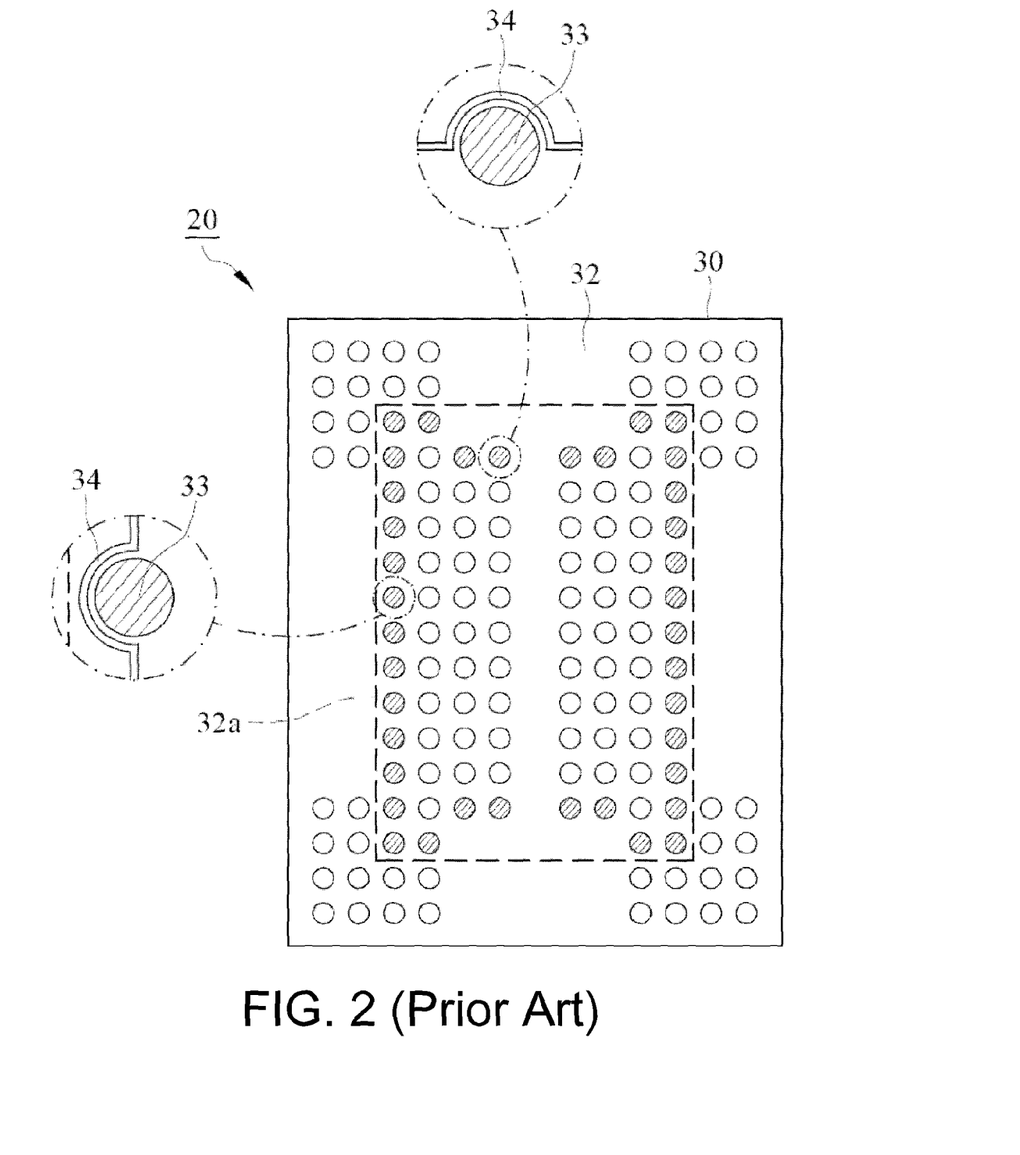
FIG. 2 is a cross-sectional view of FIG. 1 along the A-A cross-sectional line.

As shown in FIG. 1 and FIG. 2, a conventional Ball Grid Array package 20 includes a substrate 30, a chip 40 and an encapsulant 50. The chip 40 is disposed on the upper surface 31 of the substrate 30. The encapsulant 50 is formed over the upper surface 31 of the substrate 30 to encapsulate the chip 40. A plurality of external contact pads 33 and a circuitry 34 are disposed on the bottom surface 32 of the substrate 30 before performing a BGA packaging process. Additionally, the circuitry 34 and the ball pads 33 are formed in a same metal layer in the substrate 30 for signal transmission. A plurality of solder balls 35 are disposed on the external contact pads 33.

As shown in FIG. 1 and FIG. 2 again, a chip projective area 32a is defined inside the bottom surface 32 of the substrate 30 by projecting the edges of the chip 20 from the upper surface 31 to the opposing bottom surface 32. The circuitry 34 is located outside some outermost external contact pads 33 positioned in the specific area of the chip projective area 32a so that the circuitry 34 is most vulnerable to thermal stress. During thermal cycling reliability test, the circuitry 34 is easily cracked due to thermal stress concentration leading to package failure.

SUMMARY OF THE INVENTION

The main purpose of the present invention is to provide a ball grid array package with protective circuitry layout and its substrate to avoid circuitry peeling and package failure by disposing a plurality of protective mini-pads in a dotted-line layout such as " . . . " or by forming a stress-buffering pattern in the protective area to partially surround at least an external contact pad vulnerable to thermal stress.

According to the present invention, a ball grid array package with protective circuitry layout comprises a chip and a substrate. The chip has an active surface and a plurality of edges around the active surface. The substrate includes an upper surface, a bottom surface opposite to the upper surface, a plurality of first contact pads, a circuitry and a plurality of protective mini-pads. The chip is disposed on the upper surface of the substrate. The bottom surface of the substrate includes a chip projective area defined inside and a peripheral area surrounding the chip projective area. The chip projective area is established by vertically projecting the edges of the chip on the upper surface to the bottom surface of the substrate. The first contact pads are located inside the chip projective area on the bottom surface. The first contact pads include at least an external contact pad adjacent to the peripheral area, wherein a protective area and a wiring area are respectively defined in the chip projective area at two opposing sides of the external contact pad. The circuitry is disposed inside the wiring area on the bottom surface. The protective area is located between the wiring area and the peripheral area. The protective mini-pads are arranged in a dotted-line layout and disposed inside the projective area to partially surround the external contact pads, wherein the protective mini-pads are not connected to the circuitry.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 3:
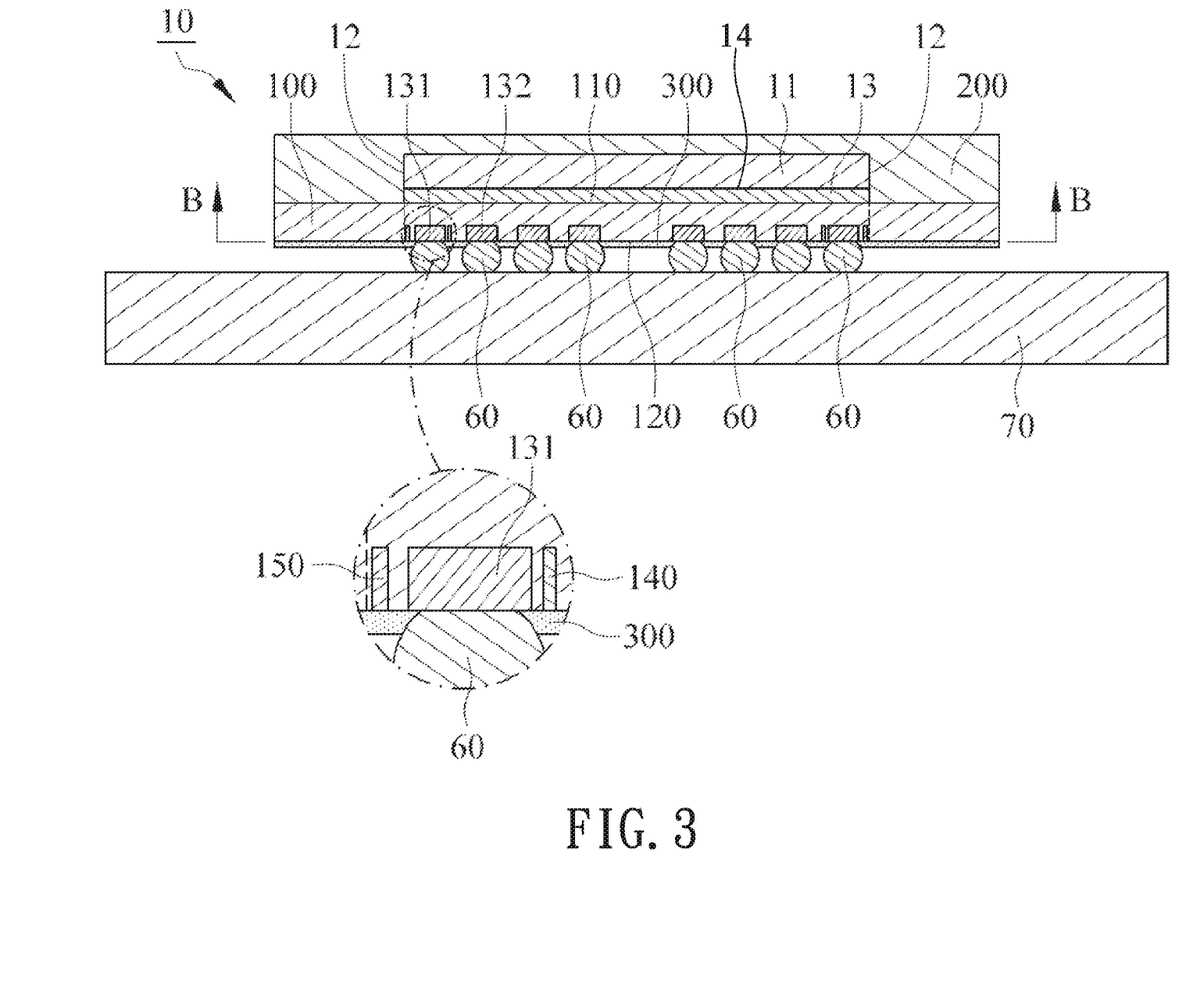
FIG. 3 is a cross-sectional view of a Ball Grid Array package with protective circuitry layout surface-mounted on a printed circuit board through a plurality of solder balls according to the first embodiment of the present invention.

According to the first embodiment of the present invention, a cross-sectional view of a Ball Grid Array package 10 with protective circuitry layout is shown in FIG. 3. The ball grid array package 10 is disposed on a printed circuit board 70 through a plurality of solder balls 60. The ball grid array package 10 comprises a chip 11 and a substrate 100. The ball grid array package 10 further comprises an encapsulant 200. The chip 11 has an active surface 14 and a plurality of edges 12 around the active surface 14. And, the chip 11 is disposed on an upper surface 110 of the substrate 100. The encapsulant 200 is formed over the upper surface 110 of the substrate 100 to encapsulate the chip 11. Therein, the chip 11 may be one of various semiconductor materials such as Silicon (Si), Silicon Carbide (SiC), Gallium Arenide (GaAs), etc., with an IC circuitry disposed on the active surface 14. The edges 12 may be a plurality of cut sides of the chip 11 formed during singulation. The substrate 100 is an IC carrier. The chip 11 is electrically connected to the substrate 100 by wire-bonding or by flip-chip process. A die-attach material 13 or an underfill material is disposed between the chip 11 and the substrate 100 to firmly fix the chip 11 on the substrate 100. The encapsulant 200 may be an isolation material such as resin, polymer, etc. For example, the encapsulant 200 may be an Epoxy Molding Compound (EMC).

Figure 4:
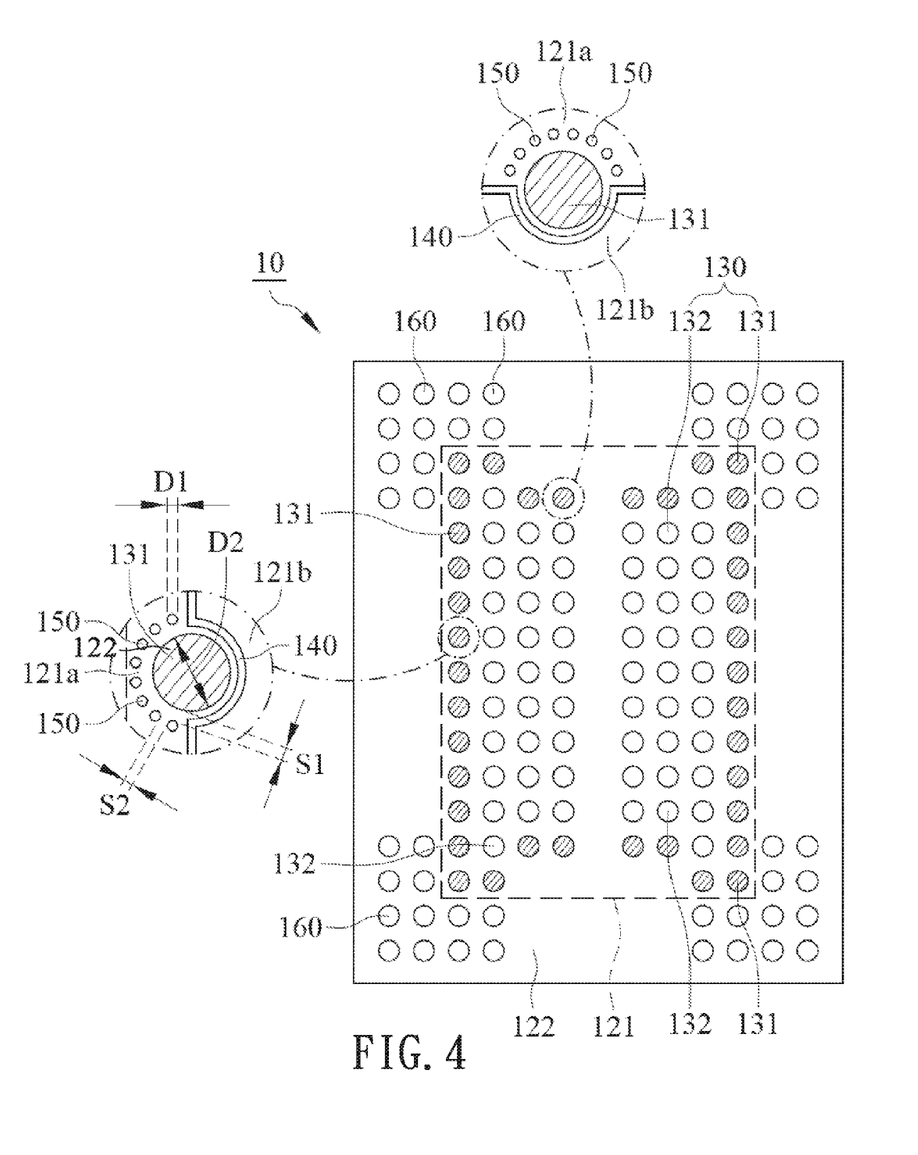
FIG. 4 is a cross-sectional view of FIG. 3 along the B-B cross-sectional line.

As shown in FIG. 3 and FIG. 4, the substrate 100 has a bottom surface 120 opposite to the upper surface 110. The bottom surface 120 of the substrate 100 includes a chip projective area 121 formed in the interior area of the substrate 100 and a peripheral area 122 surrounding the chip projective area 121. The chip projective area 121 is defined by vertically projecting the edges 12 of the chip 11 to the upper surface 110 and through to the bottom surface 120 of the substrate 100. The area of the chip projective area 121 is equivalent to the area of the substrate 100 covered by the chip 11. The peripheral area 122 is equivalent to the area of the substrate 100 outside the area covered by the chip 11. As shown in FIG. 4, a plurality of first contact pads 130 are disposed inside the chip projective area 121 on the bottom surface 120. And, the first contact pads 130 include at least an external contact pad 131 adjacent to the peripheral area 122. The external contact pad 131 may experience thermal stress. The first contact pads 130 may further include a plurality of internal contact pads 132 surrounded by external contact pads 131. A plurality of second contact pads 160 may be located in the peripheral area 122 of the bottom surface 120. In the first embodiment, the second contact pads 160 may be contact pads disposed in the periphery of corners of the chip projective area 121 as shown in FIG. 4. The external contact pad 131 of the first contact pads 130 and the second contact pads 160 are individually exposed through a plurality of openings of a solder mask 300 where solder balls 60 are disposed. The solder mask 300 is disposed on the bottom surface 120 of the substrate 100 and is patterned to have the openings. As shown in FIG. 4, the external contact pads 131 disposed nearest to the periphery of the chip projective area 121 are the most vulnerable to thermal stress. The external contact pads 131 disposed nearest to the periphery of the chip projective area 121 may be arranged in a ring formation. Therein, the external contact pad 131, the internal contact pads 132 and the second contact pads 160 may be formed in the same metal layer.

As shown in FIG. 4, a protective area 121a and a wiring area 121b are disposed in the chip projective area 121. The protective area 121a and a wiring area 121b are disposed at opposing sides of the external contact pad 131. The protective area 121a is disposed between the wiring area 121b and the peripheral area 122. Therefore, the wiring area 121b is at a distance from the boundary of the chip projective area 121. A circuitry 140 is disposed inside the wiring area 121b on the bottom surface 120 for signal transmission or for power/ground. The circuitry 140 adjacent to the external contact pad 131 may be arc-shaped to partially surround the external contact pad 131. A stress buffering pattern is disposed inside the protective area 121a partially surrounding the external contact pad 131. In the present embodiment, the stress-buffering pattern comprise of a plurality of protective mini-pads 150 arranged in a dotted-line layout such as " . . . ". The protective mini-pads 150 are not coupled to the circuitry 140. The protective mini-pads 150 are dummy pads. The protective mini-pads 150 are not used for conductive connections. The protective mini-pads 150 may be completely covered by the solder mask 300. The first contact pads 130, the circuitry 140 and the protective mini-pads 150 are formed in a same metal layer of the substrate 100. The purpose of the protective mini-pads 150 is to avoid thermal stress concentration on the protective area 121a and prevent circuit cracks in the protective area 121a. Thus, the processing yield may be greatly increased. The protective mini-pads 150 partially surrounding the external contact pad 131 are arranged in an arc-shaped to evenly disperse and absorb the thermal stress concentrated on the protective area 121a.

As shown in FIG. 4, a first spacing S1 is a distance between the protective mini-pads 150 and the external contact pad 131. The first spacing S1 is less than or equal to 150 μm. The second spacing S2 is a distance between two protective mini-pads 150. The second spacing S2 may be less than the first spacing S1 to maximize the protective effects. In the present embodiment, the unit diameter D1 of the protective mini-pads 150 is less than the unit diameter D2 of the external contact pad 131. A third spacing formed from the circuitry 140 to the external contact pad 131 is less than the first spacing S1. In this way, the circuit crack issue is eliminated. The circuitry 140 may be formed as close to the external contact pad 131 as possible without electrical short to meet the requirements of high density circuits. The thermal stress exerted on the external contact pad 131 may be dispersed to and absorbed by the protective mini-pads 150 to avoid circuit crack issues.

Therefore, a Ball Grid Array package with protective circuitry layout is provided in the present invention. To avoid circuitry peeling and package failure, a plurality of protective mini-pads are formed in a dotted-line layout such as " . . . " or a similar stress-buffering pattern in the protective area to partially surround the external contact pad.

Figure 5:
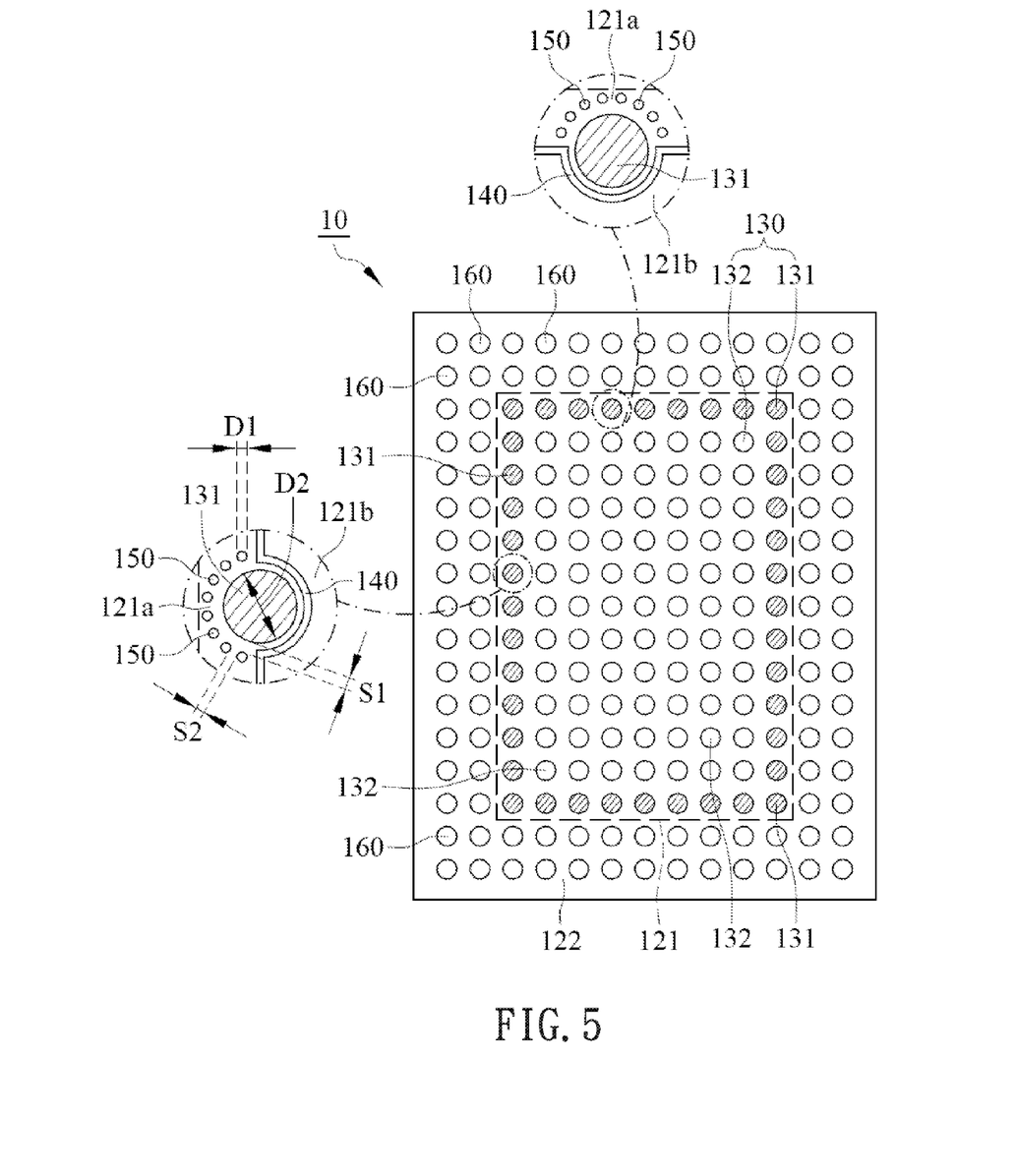
FIG. 5 is a cross-sectional view along a bottom surface of a substrate of another Ball Grid Array package with protective circuitry layout according to the second embodiment of the present invention.

The second embodiment of the present invention is shown in FIG. 5. The major difference between the first embodiment and the second embodiment is the locations of the second contact pads 160. The second contact pads 160 are not limited to being disposed to the corners of the peripheral area 122. The second contact pads 160 may be evenly distribute over the whole peripheral area 122. Similar to the first embodiment, in the second embodiment, a plurality of protective mini-pads 150 are disposed inside the protective area 121a on the bottom surface 120. The protective mini-pads 150 may not be coupled to the circuitry 140. The protective mini-pads 150 may be used to effectively avoid circuit cracks in the protective area 121a. The protective mini-pads 150 are also not coupled to one another.

Figure 6:
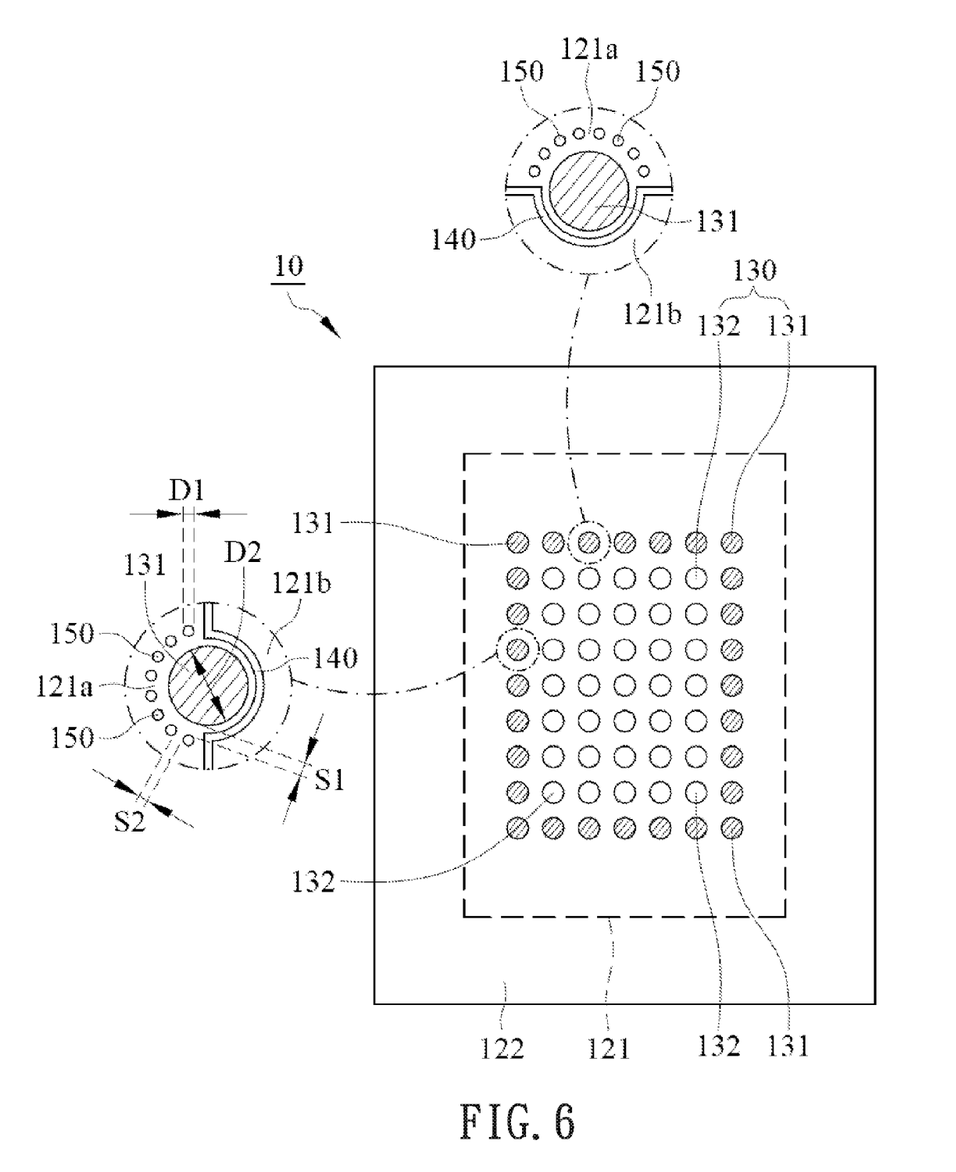
FIG. 6 is a cross-sectional view along a bottom surface of a substrate of another Ball Grid Array package with protective circuitry layout according to the third embodiment of the present invention.

The third embodiment of the present invention is shown in FIG. 6. The major difference between the first embodiment and the third embodiment is that there is no second contact pad 160 and the first contact pads 130 are further distanced from the periphery of the chip projective area 121 as compared to the first embodiment and the second embodiment. The spacing between the external contact pad 131 and the peripheral area 122 is greater as compared to the first embodiment and the second embodiment. But similarly, in the present embodiment, a plurality of protective mini-pads 150 are disposed inside the protective area 121a on the bottom surface 120 without connecting to the circuitry 140 to effectively avoid circuit cracks in the protective area 121a.

According to the present invention, the protective mini-pads 150 in a dotted-line layout such as " . . . " are disposed inside the protective area 121a on the bottom surface 120 to partially surround the external contact pad 131 so that the protective mini-pads 150 are evenly dispersed to absorb the thermal stress exerted at the protective area 121*a* to avoid thermal stress concentrated on the protective area 121*a* leading to circuit cracks to effectively enhance processing yield.

The above description of embodiments of this invention is intended to be illustrative but not limited. Other embodiments of this invention may be obvious to those skilled in the art in view of the above disclosure which still may be covered by and within the scope of the present invention even with any modifications, equivalent variations and adaptations.

What is claimed is:

1. A semiconductor package comprising:
   a chip having an active surface and a plurality of edges around the active surface; and
   a substrate including:
   an upper surface on which the chip is disposed;
   a bottom surface opposing to the upper surface; the bottom surface having a chip projective area defined inside the substrate and a peripheral area surrounding the chip projective area, wherein the chip projective area is established by vertically projecting the edges of the chip to the upper surface and through the substrate and to the bottom surface of the substrate;
   a plurality of first contact pads disposed inside the chip projective area on the bottom surface, wherein the first contact pads include at least an external contact pad adjacent to the peripheral area, wherein a protective area and a wiring area are disposed in a periphery of the external contact pad on the chip projective area opposite to each other;
   a circuitry disposed inside the wiring area on the bottom surface; and
   a plurality of protective mini-pads having a dotted-line layout disposed inside the projective area on the bottom surface to partially surround the external contact pad, wherein the protective mini-pads are not coupled to the circuitry.

2. The semiconductor package as claimed in claim 1, wherein the substrate further includes a solder mask on the bottom surface to completely cover the protective mini-pads.

3. The semiconductor package as claimed in claim 1, wherein a first spacing is a spacing between the protective mini-pads and the external contact pad and a second spacing not greater than the first spacing formed is a spacing between two protective mini-pads.

4. The semiconductor package as claimed in claim 3, wherein a third spacing less than the first spacing is a spacing between the circuitry and the external contact pad.

5. The semiconductor package as claimed in claim 1, wherein the substrate further includes a plurality of second contact pads disposed on the peripheral area of the bottom surface.

6. The semiconductor package as claimed in claim 1, wherein the protective mini-pads surrounding the external contact pad are positioned in an arc-shaped arrangement.

7. The semiconductor package as claimed in claim 1, wherein a unit diameter of the protective mini-pads is less than a unit diameter of the external contact pad.

8. A substrate of a semiconductor package for disposing a chip having a plurality of edges, comprising:
   an upper surface for disposing the chip;
   a bottom surface opposing to the upper surface, the bottom surface a chip projective area defined inside and a peripheral area surrounding the chip projective area, wherein the chip projective area is established by vertically projecting the edges of the chip on the upper surface through the substrate and to the bottom surface of the substrate;
   a plurality of first contact pads located inside the chip projective area on the bottom surface, wherein the first contact pads include at least an external contact pad adjacent to the peripheral area, wherein a protective area and a wiring area are disposed in a periphery of the external contact pad on the chip projective area opposite to each other;
   a circuitry disposed inside the wiring area on the bottom surface; and
   a plurality of protective mini-pads having a dotted-line layout disposed inside the projective area on the bottom surface to partially surround the external contact pad, wherein the protective mini-pads are not connected to the circuitry.

9. The substrate as claimed in claim 8, wherein the substrate further includes a solder mask on the bottom surface to completely cover the protective mini-pads.

10. The substrate as claimed in claim 8, wherein a first spacing is a spacing between the protective mini-pads and the external contact pad and a second spacing not greater than the first spacing formed is a spacing between two protective mini-pads.

11. The substrate as claimed in claim 10, wherein a third spacing less than the first spacing is a spacing between the circuitry and the external contact pad.

12. The substrate as claimed in claim 8, wherein the substrate further includes a plurality of second contact pads disposed in the peripheral area of the bottom surface.

13. The substrate as claimed in claim 8, wherein the protective mini-pads surrounding the external contact pad are positioned in an arc-shaped arrangement.

14. The substrate as claimed in claim 8, wherein a unit diameter of the protective mini-pads is less than a unit diameter of the external contact pad.

15. A semiconductor package comprising:
   a chip having an active surface and a plurality of edges around the active surface; and
   a substrate including:
   an upper surface on which the chip is disposed;
   a bottom surface opposing to the upper surface, the bottom surface having a chip projective area defined inside and a peripheral area surrounding the chip projective area, wherein the chip projective area is established by vertically projecting the edges of the chip on the upper surface, through the substrate, and to the bottom surface of the substrate;
   a plurality of first contact pads located inside the chip projective area on the bottom surface, wherein the first contact pads include at least an external contact pad adjacent to the peripheral area, wherein a protective area and a wiring area are disposed in a periphery of the external contact pad on the chip projective area opposite to each other;
   a circuitry disposed inside the wiring area on the bottom surface; and
   a stress-buffering pattern selected from a group comprising of a plurality of protective mini-pads, a plurality of pad holes and a plurality of mesh holes arranged in a dotted-line layout, wherein the stress-buffering pattern is disposed inside the protective area on the bottom surface to partially surround the external contact pad, wherein the stress-buffering pattern is not coupled to the circuitry, wherein the first contact pads, the circuitry and the stress-buffering pattern are formed in a same metal layer.

16. The semiconductor package as claimed in claim 15, wherein the substrate further includes a solder mask on the bottom surface to completely cover the stress-buffering pattern.

\* \* \* \* \*